(12) United States Patent
Fujisaki

(10) Patent No.: US 7,636,877 B2
(45) Date of Patent: Dec. 22, 2009

(54) TEST APPARATUS HAVING A PATTERN MEMORY AND TEST METHOD FOR TESTING A DEVICE UNDER TEST

(75) Inventor: Kenichi Fujisaki, Tokyo (JP)

(73) Assignee: Advantest Corporation, Tokyo (JP)

( * ) Notice: Subject to any disclaimer, the term of this patent is extended or adjusted under 35 U.S.C. 154(b) by 211 days.

(21) Appl. No.: 11/774,615

(22) Filed: Jul. 9, 2007

(65) Prior Publication Data

US 2007/0271045 A1 Nov. 22, 2007

Related U.S. Application Data

(63) Continuation of application No. PCT/JP2006/302549, filed on Feb. 14, 2006.

(30) Foreign Application Priority Data

Feb. 28, 2005 (JP) ............................. 2005-054190

(51) Int. Cl.
*G01R 31/28* (2006.01)
(52) U.S. Cl. .................................... 714/736
(58) Field of Classification Search ................. 714/736
See application file for complete search history.

(56) References Cited

U.S. PATENT DOCUMENTS

| | | | | |
|---|---|---|---|---|
| 4,107,649 A | * | 8/1978 | Kurihara | 714/703 |
| 5,392,301 A | * | 2/1995 | Fukushima | 714/766 |
| 5,606,662 A | * | 2/1997 | Wisor | 714/48 |
| 5,844,924 A | * | 12/1998 | Nagamoto | 714/802 |
| 6,041,426 A | * | 3/2000 | Qureshi | 714/719 |
| 6,473,880 B1 | * | 10/2002 | Cypher | 714/800 |
| 6,539,503 B1 | * | 3/2003 | Walker | 714/703 |
| 6,598,197 B1 | * | 7/2003 | Peterson et al. | 714/763 |
| 7,103,493 B2 | * | 9/2006 | Kang et al. | 702/117 |
| 7,447,950 B2 | * | 11/2008 | Takahashi et al. | 714/702 |

FOREIGN PATENT DOCUMENTS

| | | |
|---|---|---|
| DE | 19741174 | 3/1989 |
| JP | 53-070729 | 6/1978 |

(Continued)

OTHER PUBLICATIONS

Taiwanese Office Action for Application No. 09820408740, mailed on Jul. 6, 2009 (10 pages).

*Primary Examiner*—James C Kerveros
(74) *Attorney, Agent, or Firm*—Osha • Liang LLP

(57) ABSTRACT

The test apparatus includes: a pattern memory that stores therein data to be outputted to the device under test; a device judgment section that judges whether the device under test passes or fails based on an output signal; the number of data information storage section that stores therein the number of data information based on the number of logic H data included in an input data; a counter that receives output data outputted from the pattern memory to the device under test and counts the number of logic H data included in the output data; a pattern memory judgment section that judges that the data stored in the pattern memory is correct when the number of data information on the input data is corresponding to the number of logic H data counted by the counter and outputs a signal according to this judgment result.

10 Claims, 5 Drawing Sheets

FOREIGN PATENT DOCUMENTS

| | | |
|---|---|---|
| JP | 61-165158 | 7/1986 |
| JP | 01-187475 | 7/1989 |
| JP | 04-307500 | 10/1992 |
| JP | 2000-065904 | 3/2000 |
| JP | 2001-005736 | 1/2001 |
| WO | 2006/092953 | 9/2006 |

* cited by examiner

PATTERN MEMORY 34

| MEMORY ADDRESS | DATA | | | | | | | | |
|---|---|---|---|---|---|---|---|---|---|
| 0000 | 0 | 0 | 0 | 1 | 0 | 0 | 1 | 0 | 1 |
| 0001 | 0 | 0 | 1 | 1 | 0 | 0 | 1 | 0 | 1 |
| 0002 | 0 | 1 | 1 | 1 | 0 | 0 | 1 | 1 | 1 |
| ········ | ········ | ········ | ········ | ········ | ········ | ········ | ········ | ········ | ········ |
| XXXX | 1 | 1 | 1 | 0 | 0 | 1 | 0 | 0 | 0 |

| BIT POSITION | 1 | 2 | 3 | 4 | 5 | 6 | 7 | 8 | 9 |
|---|---|---|---|---|---|---|---|---|---|
| NUMBER OF DATA INFORMATION (NDI) | $a_1$ | $a_2$ | $a_3$ | $a_4$ | $a_5$ | $a_6$ | $a_7$ | $a_8$ | $a_9$ |

*FIG. 3*

TEST APPARATUS HAVING A PATTERN MEMORY AND TEST METHOD FOR TESTING A DEVICE UNDER TEST

CROSS REFERENCE TO RELATED APPLICATION

This is a continuation application of PCT/JP2006/302549 filed on Feb. 14, 2006 which claims priority from a Japanese Patent Application NO. 2005-054190 filed on Feb. 28, 2005, the contents of which are incorporated herein by reference.

BACKGROUND

1. Technical Field

The present invention relates to a test apparatus and a test method. More particularly, the present invention relates to a test apparatus and a test method for testing a device under test.

2. Related Art

Generally, as a test apparatus that tests a device under test such as a semiconductor memory, and apparatus has been known, which has a tuning generator, a pattern generator, a waveform shaper, a logic comparator, a fail analysis memory and a pattern memory.

The timing generator generates a reference clock to regulate the operation of the test apparatus. The pattern generator generates an address signal, a data signal and a control signal provided to the device under test. The wave form shaper generates a test signal based on those signals and provides the same to the device under test. The pattern memory stores therein a prepared data signal and expected value signal. The waveform shaper may generate a test signal based on the data signal stored in the pattern memory. The logic comparator compares an output signal from the device under test with the expected value signal and generates fail data indicative of pass/fail. The fail data is stored in the fail analysis memory.

Here, any related patent document is not currently found, so that the description is omitted.

SUMMARY

Recently, the capacity of such as a semiconductor memory has been increased, therefore, the pattern memory has to have a large capacity when a test is performed by using data stored in the pattern memory. Thus, it has been difficult to assure that all the data stored in the pattern memory are correct. For example, a possibility for generating any error in the stored data is increased due to such as soft error of the pattern memory. In addition, when a test is repeatedly performed by using the data stored in the pattern memory several times, the data having the error could be repeatedly used.

In a case that the data stored in the pattern memory is used as only the expected value signal in the test, a mismatch between the output signal and the expected value signal is detected even if any error is occurred in the expected value signal, so that the error can be detected in the test. However, when data stored in the pattern memory is used as write data to the ROM and the data is also used as the expected value signal, the error in the data is not detected, so that erroneous data could be written to the ROM. Then, when such ROM is implemented in a system which is actually used, the system is not correctly operated, and it will be a serious problem.

Thus, the object of the present invention is to provide a waveform converting apparatus, a waveform converting method and a test apparatus which are capable of solving the problem accompanying the conventional art. The above and other objects can be achieved by combining the features recited in independent claims. Then, dependent claims define further effective specific example of the present invention.

In order to solve the above described problem, a first aspect of the present invention provides a test apparatus that tests a device under test. The test apparatus includes: a pattern memory that stores therein data to be outputted to the device under test; a device judgment section that judges whether the device under test passes or fails based on an output signal outputted from the device under test; the number of data information storage section that stores therein the number of data information based on the number of logic H data included in an input data to be stored in the pattern memory; a counter that receives output data outputted from the pattern memory to the device under test and counts the number of logic H data included in the output data; a pattern memory judgment section that judges that the data stored in the pattern memory is correct when the number of data information on the input data stored in the number of data information storage section is corresponding to the number of logic H data counted by the counter and outputs a signal according to this judgment result.

The device judgment section may judge whether the device under test passes or fails based on the output signal outputted from the device under test when the pattern memory judgment section judges that the data stored in the pattern memory is correct.

The test apparatus may further include a count selecting section that receives the input data and the output data, selects the input data and provides the same to the counter when the input data is written to the pattern memory, causes the counter to acquire the number of data information on the input data, and selects the output data and provides the same to the counter when the pattern memory outputs the output data. The number of data information storage section may store the number of data information on the input data acquired by the counter.

Each word of the input data and the output data may have a plurality of bits, the counter may count the logic H data on each bit position of the word and acquire a count value of the logic H data on each bit position as the number of data information.

The counter includes a plurality of counters arranged corresponding to a plurality of bit positions of the word. Each of the counters counts the logic H data on the corresponding bit position. The number of data information storage section includes a plurality of the number of data information storage sections arranged corresponding to the plurality of counters. Each of the number of data information storage section may store the number of logic H data for the input data counted by the corresponding counter.

The pattern memory judgment section may include a plurality of comparators arranged corresponding to the plurality of bit positions, each of the plurality of comparator compares for each bit position the number of data information on the input data with the number of data information on the output data and a judgment unit that judges that the data stored in the pattern memory is correct when all the comparison result of the plurality of comparators are matched.

A second aspect of the present invention provides a method for testing a device under test. The method includes the steps of: storing therein data to be outputted to the device under test; judging whether the device under test passes or fails based on an output signal outputted from the device under test; storing therein the number of data information based on the number of logic H data included in an input data to be stored in the pattern memory; receiving output data outputted from the pattern memory to the device under test and making a counter acquire the number data information of the output data; judging that the data stored in the pattern memory is correct by comparing the number of data information on the input data stored in the number of data information storage section with the number of data information on the output data acquired in the counting step; and outputting a signal according to this judgment result.

Here, all necessary features of the present invention are not listed in the summary of the invention. The sub-combinations of the features may become the invention.

BRIEF DESCRIPTION OF THE DRAWINGS

FIG. 3 is an explanatory diagram of the number of data information;

DESCRIPTION OF EXEMPLARY EMBODIMENTS

The embodiments of the invention will now be described based on the preferred embodiments, which do not intend to limit the scope of the present invention, but just exemplify the invention. All of the features and the combinations thereof described, in the embodiment are not necessarily essential to the invention.

Figure 1:
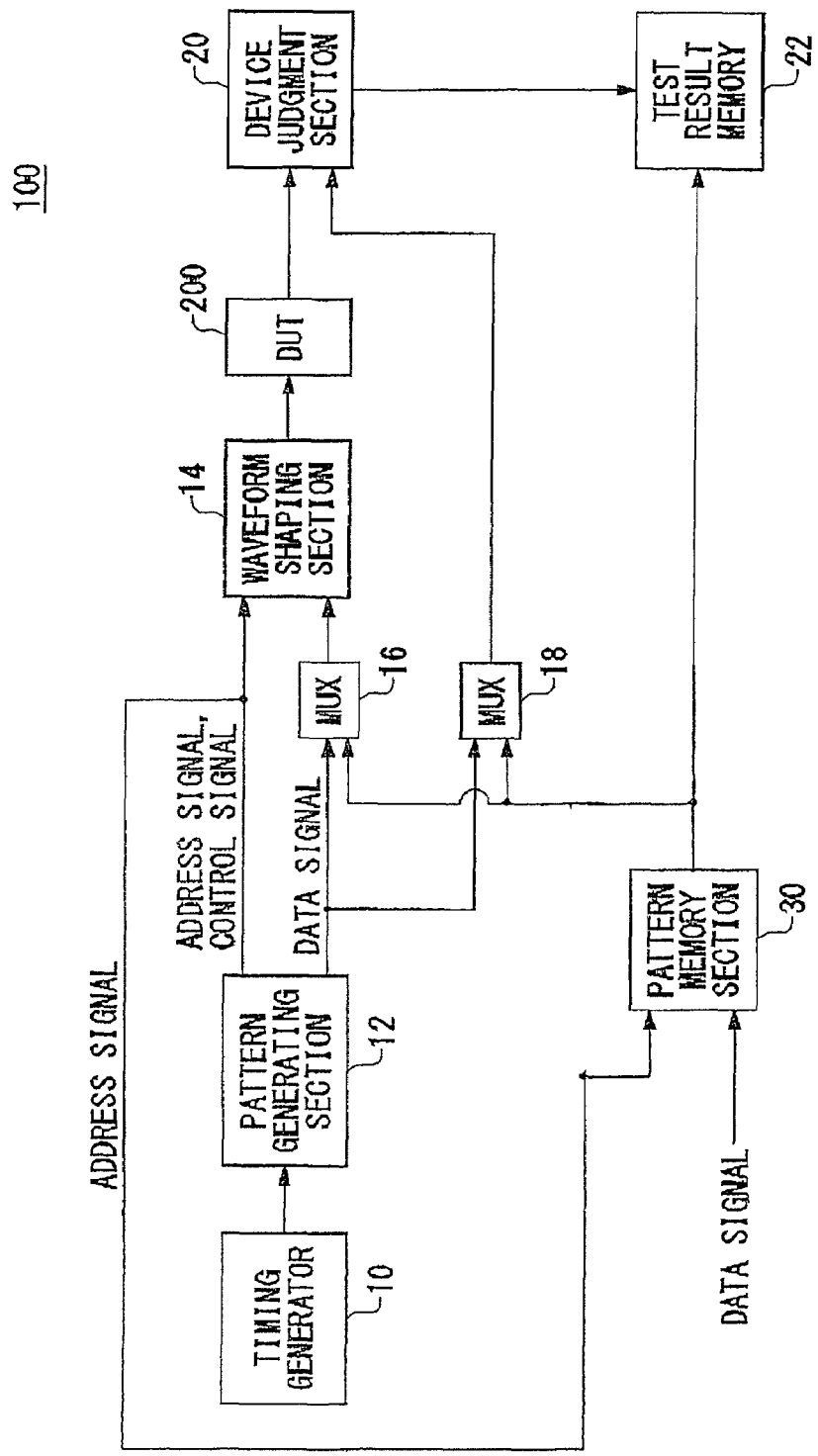
FIG. 1 shows an example of configuration of a test apparatus 100 according to an embodiment of the present invention.

FIG. 1 shows an example of configuration of a test apparatus 100 according to an embodiment of the present invention. The test apparatus 100 tests a device under test 200 such as a semiconductor memory and includes a timing generating section 10, a pattern generating section 12, an waveform shaping section 14, a data selecting section 16, an expected value selecting section 13, a device judgment section 20, a test result memory 22 and a pattern memory 30.

The timing generating section 10 generates a reference clock to regulate the operation of the test apparatus 100 and provides the same to each component of the test apparatus 100. The pattern generating section 12 generates an address signal; a control signal and a data signal; to generate a test signal for testing the device under test 200. The address signal designates the address of the device under test to which the test signal should be provided. The data signal indicates the pattern of the test signal. The control signal controls the operation of the waveform shaping section 14.

The pattern memory section 30 stores a prepared data signal. The data signal may be provided from the outside and may be generated by the pattern generating section 12. The pattern generating section 12 generates an address signal to designate the address of the pattern memory section 30. The pattern memory section 30 stores the data signal on the address corresponding to the address signal. The data selecting section 16 selects either the data signal generated by the pattern generating section 12 or the data signal stored in the pattern memory section 30 and provides the selected one to the waveform shaping section 14.

The waveform shaping section 14 generates a test signal provided to the device under test 200 based on the control signal and the data signal and provides the test signal to the address of the device under test 200 corresponding to the address signal. The expected value selecting section 18 selects one of the data signal generated by the pattern generating section 12 or the data signal stored in the pattern memory section 30, which is selected by the data selecting section 16 and provides the selected one to the device judgment section 20.

The device judgment section 20 compares the output signal read from the device under test 200 with the expected value signal and judges whether the device under test 200 passes or fails. The expected value signal for each address of the device under test 200 is provided to the device judgment section 20. Then, the device judgment section 20 compares each address of the device under test 200 with the read output signal to judge whether the device under test 200 passes or fails for each address. The test result memory 22 stores fail data indicative of pass/fail of each address of the device under test 200.

Figure 2:
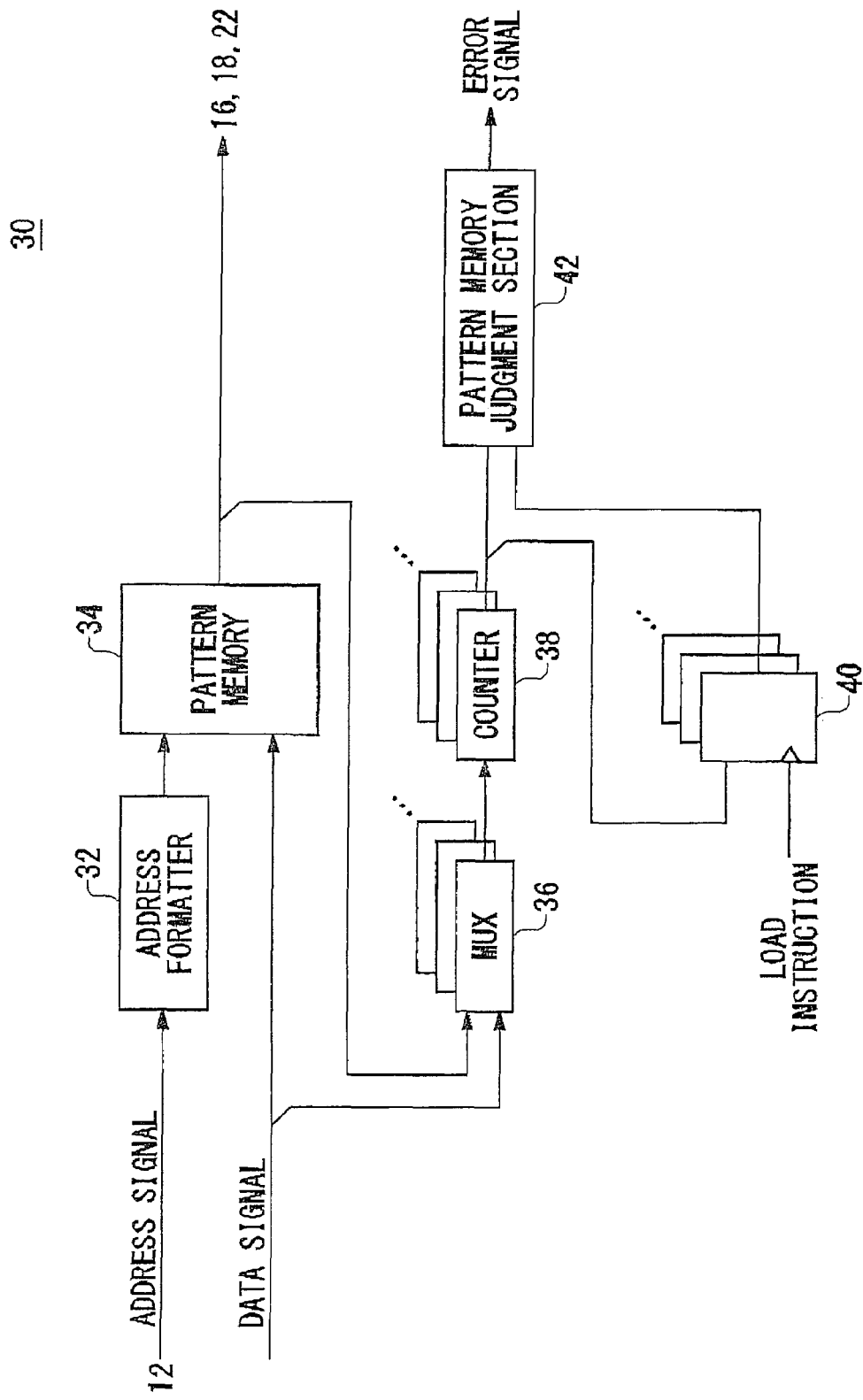
FIG. 2 shows an example of configuration of a pattern memory section 30.

FIG. 2 shows an example of configuration of the pattern memory 30. The pattern memory section 30 according to the present embodiment stores the number of data information on logic H data included in an input data which is previously provided before testing and compares the number of logic H data included in an output signal outputted on testing with the number of data information to judge whether there is any error in the output data signal. Here, the logic H data is not limited to data indicative of the value 1 in the data signal. That is, the processing may be performed under the condition that the data indicative of the value 0 of a data signal as the logic H data, and the data indicative of the value 1 of the data signal as the logic L data. The pattern memory section 30 includes an address formatter 32, a pattern memory 34, a count selecting section 36, a counter 38, the number of data information storage section 40 and a pattern memory judgment section 42.

Firstly, the operation for the case that a data signal is stored in the pattern memory 34 will be described. The address formatter 32 receives an address signal from the pattern generating section 12 and controls the address on which the data signal is stored in the pattern memory 34. The pattern memory 34 receives the input data signal to be outputted to the device under test 200 and stores each word in the input data signal on each address controlled by the address formatter. Here, the word indicates the unit of data to be stored on each address of the pattern memory 34.

Moreover, each word in the input data signal and the output data signal of the pattern memory 34 has a plurality of bits. Each address of the pattern memory 34 has a bit width corresponding to the bit number of each word in the input data signal.

The count selection section 36 is provided on each bit position of each word of the input data signal. For example, when the data width for each word of the input data signal is 9 bit, the pattern memory section 30 has nine count selecting sections 36. Each of the count selecting sections 36 receives the input data signal inputted to the pattern memory 34 and the output data signal outputted from the pattern memory 34. That is, the count selecting section 36 receives in parallel the data on the corresponding bit position for each word of the input data signal and the output data signal. Then, each of the count selecting section 36 selects the input data signal and provides the same to the counter 38.

The counter 38 is provided on each bit position for each word of the input data signal and counts the logic H data of the data on each bit position of the input data signal received from the count selecting section 36. The number of data information storage section 40 stores the number of data information based on the number of logic H data included in the input data signal to be stored in the pattern memory 34. In the present embodiment, the number of data information storage section 40 is provided on each bit position for each word of the input data signal and stores therein the number of data information on each bit position for each word of the input data signal. For example, the number of data information storage section 40 may store the counter value of the corresponding counter 38 as the number of data information, and also may store therein the number of information indicating whether the count value of the corresponding counter 38 is an even number. The number of data information may be generated by each counter 38 based on the own count value.

Next, an operation for the case that the pattern memory 34 outputs a data signal will be described. The pattern memory 34 sequentially outputs the words stored in the addresses sequentially designated by the address formatter 32 as sequentially outputted data to the count selecting section 36, the data selecting section 16 and the expected value selecting section 18. The count selecting section 36 selects the output data outputted by the pattern memory 34 and provides the same to the counter 38.

The counter 38 counts the number of logic H data on each bit position of the output data signal. The pattern memory judgment section 42 compares the number of data information on each bit position stored in each of the number of data information storage section 40 with the count value of the corresponding counter 38 and judges whether the output data signal is correct. Judging that the output data signal is not correct, the pattern memory judgment section 42 may output an error signal to stop the subsequent test on the device under test, and also to judge that a ROM fails when the ROM is tested. By such control, the device under test 200 can be prevented from being tested by using an erroneous output data signal. Additionally, when the ROM is tested as the device under test 200, the ROM to which an erroneous data is written can be prevented from being delivered.

In addition, the test apparatus 100 may cause the pattern memory judgment section 42 to judge whether the data signal stored in the pattern memory 34 is correct before the test signal is provided to the device under test, and start to test the device under test 200 when the pattern memory judgment section 42 judges that the data signal is correct. By such control, it can prevent from writing an erroneous data on such as a ROM.

FIG. 3 is an explanatory diagram of the number of data information. As described above, the pattern memory 34 has a memory space with a predetermined bit width for each address.

A case that the pattern memory 34 has a 9-bit memory space for each address will be described in the present embodiment.

When the input data signal is provided to the pattern memory 34, the counter 38 counts the number of logic H data on each bit position of the pattern memory 34 as shown in FIG. 3. Then, the number of data information storage section 40 stores the number of data information based on the count value of the corresponding counter 38.

Meanwhile, there may be a method for providing a bit on each address of the pattern memory 34 in order to store the parity bit of each word. However, a general purpose product meeting the specification of the data width of the data signal for use in the test is generally used as the pattern memory 34. The data width of such memory is 9, 18 or 36 bit, so that the memory can not store a 9-bit input data signal to which the parity bit is added. Therefore, it needs to provide a separate memory having the same address area in order to store the parity bit, so that the cost is increased.

Meanwhile, the number of logic H data is counted in the vertical direction of the input data signal and the output data signal, so that the number of data information can be stored in the predetermined number of the number of data information storage section(s) 40 regardless of the number of words of the input data signal and the output data signal in the present embodiment. Moreover, information indicating whether the number of logic, H data in the vertical direction is an odd number or an even number is stored as the number of data information, and 1-bit register is provided for each bit width of the input data, so that the number of data information can be stored.

Figure 4:
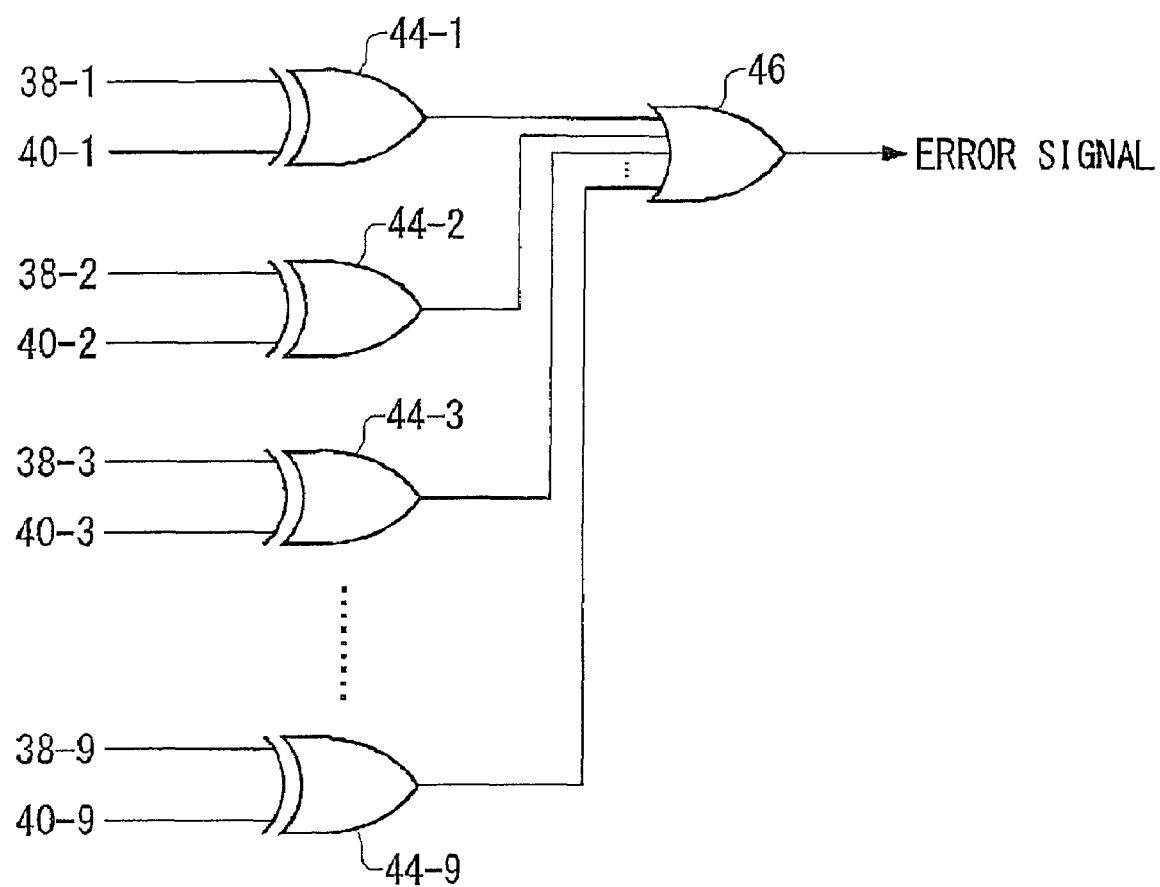
FIG. 4 shows all examples of configuration of a pattern memory judgment section 42.

FIG. 4 shows an example of configuration of a pattern memory judgment section 42. The pattern memory judgment section 42 includes each of a plurality of comparator (44-1 to 44-9, hereinafter generically referred to as 44) which are provided on each bit position of each word of the input data signal, and a judgment unit 46.

Each of the comparators 44 compares the number of data information on the output data signal outputted by the corresponding counter 38 with the number of data information on the input data signal stored in the corresponding number of data information storage section 40. Each of the comparators 44 is an exclusive OR circuit, which outputs 0 when the number of data information are matched with each other and outputs 1 when the number of data information are not matched in the present embodiment.

Then, the judgment unit 46 calculates the logical sum of the comparison result outputted by each of the comparators 44. The judgment unit 46 is an OR circuit in the present embodiment. The judgment unit 46 outputs 0 when the number of data information on all the bit positions of the data signals are matched with each other, and outputs 1 when at least one of the number of data information on each bit position of the data signal is not matched with. By such feature, it can be easily judged whether any error in the output data signal is occurred.

Figure 5:
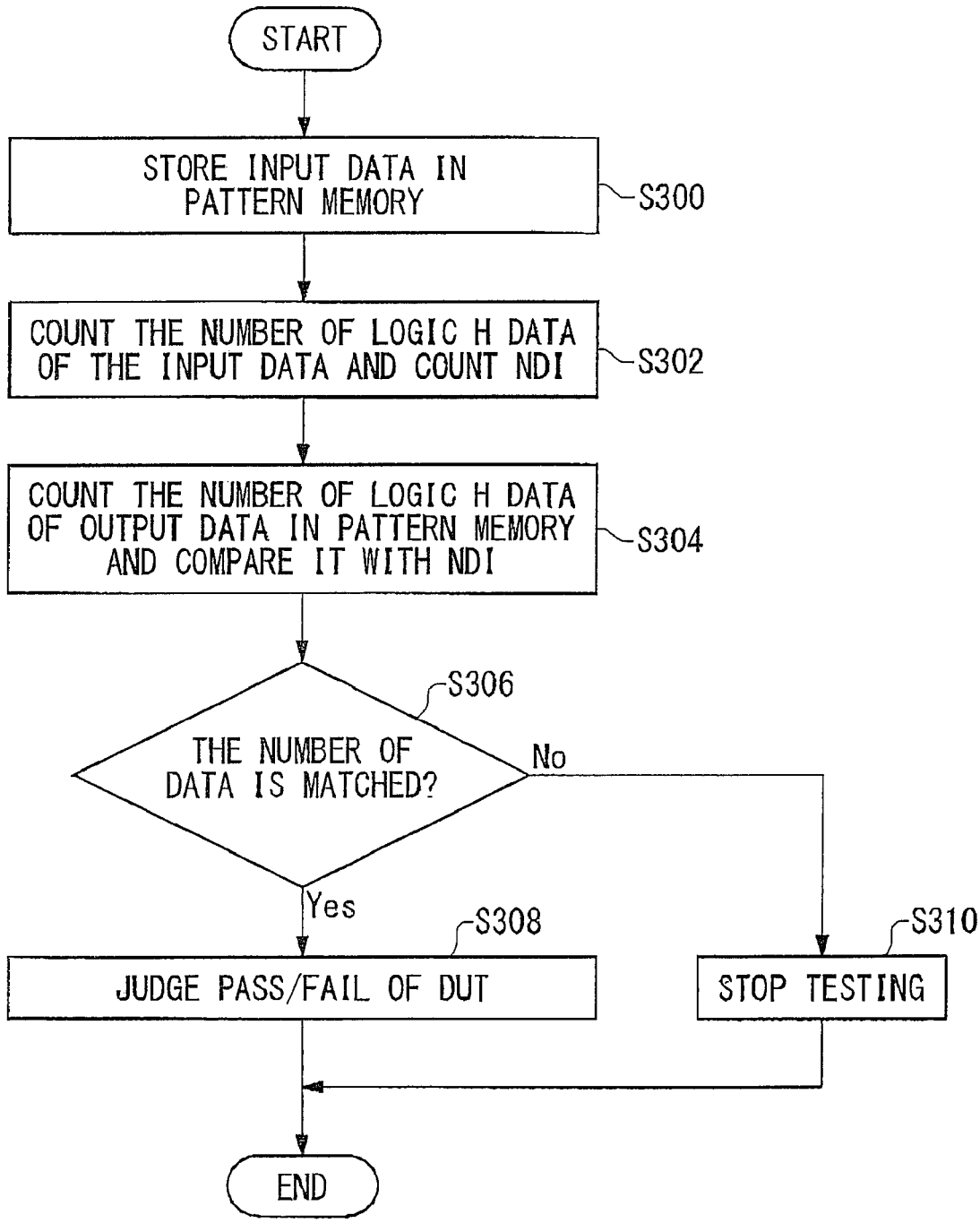
FIG. 5 is a flowchart showing an example of method for testing a device under test 200.

FIG. 5 is a flowchart showing an example of method for testing a device under test 200. The test method according to the present embodiment tests the device under test 200 by using the test apparatus 100 described with reference to FIG. 1-FIG. 4.

Firstly, the input data signal is stored in the memory 34 (S300). Then, the number of logic H data of the input data signal is counted and the number of data information is stored (S302). As described above, it is preferred that the number of data information on each bit position of the input data signal is stored in S302.

Next, the number of data information on the output data signal and the number of data information on the input data signal are compared (S304). Then, when the number of data information is matched with each other, pass/fail of the device under test 200 is judged (S306). Meanwhile, when the number of data information are not matched each other, the test of the device under test 200 is stopped (S308). In addition, when the number of data information are not matched each other, the pattern memory 34 may output the output data signal again and repeat the processing of S304. By repeating judging pass/fail of the output signal several times, a case that error occurs due to such as noise but the data signal stored in the pattern memory has no error can be judged.

Moreover, when the pattern memory 34 does not output each word in the order of addresses, for, example, when the address designated by the address formatter 32 is partially looped, the number of data information on the output data signal counted by the counter 38 is not corresponding to the number of data information on the input data signal. As described above, when a part of the data signal stored in the pattern memory 34 is repeatedly used, the address formatter 32 may provide to the counter 38 the usage count of the word of the input data signal, which is repeatedly used. The counter 38 may multiply the count result of the corresponding word by the usage count to generate the number of data information of the input signal. By such control, the number of data information on the input data signal in accordance with the pattern of the output data signal can be stored.

In addition, when the pattern memory 34 does not output each word in the order of addresses, the number of data information storage section 40 may store the number of data information on the output data signal which is outputted first by the pattern memory 34. When the test apparatus 100 repeatedly outputs the same test signal, the pattern memory 34 repeatedly outputs the same output data signal. Therefore, the number of data information of the output data signal outputted first is compared with the number of data information of the output data signal subsequently outputted, so that it can be judged whether any error is occurred in the output data signal subsequently outputted.

While the present invention has been described with the embodiment, the technical scope of the invention not limited to the above described embodiment. It is apparent to persons skilled in the art that various alternations and improvements can be added to the above-described embodiment. It is apparent from the scope of the claims that the embodiment added such alternation or improvements can be included in the technical scope of the invention.

As evidenced by the above description, according to an embodiment of the present embodiment, a device under test can be prevented from being tested by using erroneous output data. In addition, when a ROM is tested as the device under test, the ROM to which erroneous data is written can be prevented front being delivered.

What is claimed is:

1. A test apparatus that tests a device under test comprising:
    a pattern memory that stores data to be outputted to the device under test;
    a device judgment section that judges whether the device under test passes or fails based on an output signal outputted from the device under test;
    a number of data information storage section that stores the number of data information based on the number of logic H data included in an input data to be stored in the pattern memory;
    a counter that receives output data outputted from the pattern memory to the device under test and counts the number of logic H data included in the output data;
    a pattern memory judgment section that judges that the data stored in the pattern memory is correct when the number of data information of the input data stored in the number of data information storage section is corresponding to the number of logic H data counted by the counter and outputs a signal according to this judgment result; and
    a count selecting section that receives the input data and the output data, selects the input data and provides the same to the counter when the input data is written to the pattern memory, causes the counter to acquire the number of data information of the input data, and selects the output data and provides the same to the counter when the pattern memory outputs the output data,
    wherein the number of data information storage section stores the number of data information of the input data acquired by the counter.

2. The test apparatus as set forth in claim 1, the device judgment section judges whether the device under test passes or fails based on the output signal outputted from the device under test when the pattern memory judgment section judges that the data stored in the pattern memory is correct.

3. The test apparatus as set forth in claim 1, wherein
    each word of the input data and the output data has a plurality of bits, and
    the counter counts the logic H data on each bit position of the word and acquires a count value of the logic H data on each bit position as the number of data information.

4. The test apparatus as set forth in claim 3, wherein
    the counter includes a plurality of counters arranged corresponding to a plurality of bit positions of the word, each of the counters counts the logic H data on the corresponding bit position, and
    the number of data information storage section includes a plurality of the number of data, information storage sections arranged corresponding to the plurality of counters, each of the number of data information storage section stores the number of logic H data for the input data counted by the corresponding counter.

5. The test apparatus as set forth in claim 3, wherein the pattern memory judgment section including:
    a plurality of comparators arranged corresponding to the plurality of bit positions, each of the plurality of comparator compares for each bit position the number of data information of the input data with the number of data information of the output data; and
    a judgment unit that judges that the data stored in the pattern memory is correct when all the comparison result of the plurality of comparators are matched.

6. A test method for testing a device under test comprising:
    storing in a pattern memory data to be outputted to the device under test;
    judging whether the device under test passes or fails based on an output signal outputted from the device under test;
    storing number of data information based on the number of logic H data included in an input data to be stored in the pattern memory;
    receiving output data output from the pattern memory to the device under test and making a counter acquire the number of data information of the output data;
    judging that the data stored in the pattern memory is correct by comparing the number of data information of the input data with the number of data information of the output data;
    outputting a signal according to this judgment result;
    receiving the input data and the output data, selecting the input data and providing the same to the counter when the input data is written to the pattern memory, causing the counter to acquire the number of data information of the input data, and selecting the output data and providing the same to the counter when the pattern memory outputs the output data,
    wherein the number of data information storage step includes storing the number of data information of the input data acquired by the counter.

7. The test method as set forth in claim 6, wherein the device judgment step includes judging whether the device under test passes or fails based on the output signal outputted from the device under test when it is judged that the data stored in the pattern memory is correct in the pattern memory judgment step.

8. The test method as set forth in claim 6, wherein
    each word of the input data and the output data has a plurality of bits, and
    the receiving output data includes counting the logic H data on each bit position of the word and acquiring a count value of the logic H data on each bit position as the number of data information.

9. The test method as set forth in claim 8, wherein
the counter includes a plurality of counters arranged corresponding to a plurality of bit positions of the word, and
the receiving output data includes counting the logic H data on the bit position corresponding to each of the provided counters.

10. The test method as set forth in claim 8, wherein the pattern memory judgment step includes:

comparing for each bit position the number of data information of the input data with the number of data information of the output data; and judging that the data stored in the pattern memory is correct when all the comparison results for the bit positions in the comparing step are matched.

* * * * *